United States Patent
Shim et al.

(10) Patent No.: US 10,141,457 B2
(45) Date of Patent: Nov. 27, 2018

(54) SOLAR CELL

(71) Applicant: LG Electronics Inc., Seoul (KR)

(72) Inventors: Seunghwan Shim, Seoul (KR); Kisu Kim, Seoul (KR); Eunhye Youn, Seoul (KR); Yuju Hwang, Seoul (KR); Younghyun Lee, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 13/798,355

(22) Filed: Mar. 13, 2013

(65) Prior Publication Data

US 2013/0240031 A1   Sep. 19, 2013

(30) Foreign Application Priority Data

Mar. 19, 2012  (KR) .................. 10-2012-0027678

(51) Int. Cl.
  *H01L 31/00* (2006.01)
  *H01L 31/0216* (2014.01)
  *H01L 31/0224* (2006.01)
  *H01L 31/068* (2012.01)
  (Continued)

(52) U.S. Cl.
  CPC ............ *H01L 31/02168* (2013.01); *H01L 31/022425* (2013.01); *H01L 31/068* (2013.01); *H01L 31/0745* (2013.01); *H01L 31/0747* (2013.01); *Y02E 10/547* (2013.01)

(58) Field of Classification Search
  CPC ......... H01L 31/02245; H01L 31/02225; H01L 31/02168; H01L 31/068; H01L 31/0745; H01L 31/0747; Y02E 10/547
  See application file for complete search history.

(56) References Cited

U.S. PATENT DOCUMENTS

| 4,106,951 A * | 8/1978 | Masi ................... H01L 31/072 136/263 |
| 4,389,534 A * | 6/1983 | Winterling ........ H01L 31/02168 136/256 |
| 5,589,008 A * | 12/1996 | Keppner ....................... 136/259 |

(Continued)

FOREIGN PATENT DOCUMENTS

| JP | 55-141765 A | 11/1980 |
| JP | 11-008400 A | 1/1999 |

(Continued)

OTHER PUBLICATIONS

English translation of JP 11-008400.*

*Primary Examiner* — Uyen M Tran

(74) *Attorney, Agent, or Firm* — Dentons US LLP

(57) ABSTRACT

A solar cell includes a semiconductor substrate of a first conductive type, an emitter region having a second conductive type different from the first conductive type and positioned at a first surface of the semiconductor substrate, a semiconductor region positioned directly on a second surface opposite the first surface of the semiconductor substrate, forming a charge accumulation layer on the second surface of the semiconductor substrate, and containing impurities of the first conductive type, a first electrode positioned on the first surface of the semiconductor substrate and coupled to the emitter region, and a second electrode positioned on the second surface of the semiconductor substrate and coupled to the semiconductor substrate.

9 Claims, 9 Drawing Sheets

(51) Int. Cl.
    *H01L 31/0745*     (2012.01)
    *H01L 31/0747*     (2012.01)

(56) References Cited

U.S. PATENT DOCUMENTS

| | | | |
|---|---|---|---|
| 6,444,897 B1* | 9/2002 | Luque-Lopez et al. | 136/255 |
| 8,188,364 B2* | 5/2012 | Ribeyron | 136/252 |
| 2006/0065297 A1* | 3/2006 | Terakawa | 136/255 |
| 2006/0130891 A1* | 6/2006 | Carlson | 136/256 |
| 2006/0255340 A1 | 11/2006 | Manivannan et al. | |
| 2009/0223560 A1 | 9/2009 | Kim | |
| 2009/0229665 A1* | 9/2009 | Young et al. | 136/261 |
| 2009/0250108 A1 | 10/2009 | Zhou et al. | |
| 2010/0059117 A1 | 3/2010 | Shi et al. | |
| 2010/0243041 A1* | 9/2010 | Carlson et al. | 136/255 |
| 2010/0243042 A1* | 9/2010 | Shan | H01L 31/068 136/255 |
| 2011/0140226 A1* | 6/2011 | Jin et al. | 257/460 |
| 2011/0265866 A1* | 11/2011 | Oh | H01L 31/02167 136/255 |
| 2012/0055538 A1 | 3/2012 | Lee et al. | |

FOREIGN PATENT DOCUMENTS

| | | |
|---|---|---|
| JP | 2006-319335 A | 11/2006 |
| JP | 2010263222 A | 11/2010 |
| JP | 2011-129561 A | 6/2011 |
| JP | 2011-159783 A | 8/2011 |

* cited by examiner

SOLAR CELL

This application claims priority to and the benefit of Korean Patent Application No. 10-2012-0027678 filed in the Korean Intellectual Property Office on Mar. 19, 2012, the entire contents of which are incorporated herein by reference.

BACKGROUND

Field of the Disclosure
Embodiments of the invention relate to a solar cell.
Background
Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type, and thus form a p-n junction, and electrodes respectively connected to the semiconductor parts of the different conductive types.

When light is incident on the solar cell, electrons and holes are produced in the semiconductor parts. The electrons move to the n-type semiconductor part, and the holes move to the p-type semiconductor part under the influence of the p-n junction of the semiconductor parts. Then, the electrons and the holes are collected by the different electrodes respectively connected to the n-type semiconductor part and the p-type semiconductor part. The electrodes are connected to each other using electric wires to thereby obtain electric power.

SUMMARY

In one aspect, there is a solar cell including a semiconductor substrate of a first conductive type, an emitter region having a second conductive type different from the first conductive type and positioned at a first surface of the semiconductor substrate, a semiconductor region positioned directly on a second surface opposite the first surface of the semiconductor substrate, forming a charge accumulation layer on the second surface of the semiconductor substrate, and containing impurities of the first conductive type, a first electrode positioned on the first surface of the semiconductor substrate and coupled to the emitter region, and a second electrode positioned on the second surface of the semiconductor substrate and coupled to the semiconductor substrate.

An amount of impurities contained in the semiconductor region may be about $1 \times 10^{18}/cm^3$ to $5 \times 10^{20}/cm^3$.

The semiconductor region may be formed of silicon carbide.

The solar cell may further include a surface field region positioned between the second surface of the semiconductor substrate and the second electrode and having the first conductive type.

The semiconductor substrate may be formed of a crystalline semiconductor, and the emitter region may be formed of a crystalline semiconductor.

The semiconductor substrate may be formed of a crystalline semiconductor, and the emitter region may be formed of amorphous silicon.

The solar cell may further include an anti-reflection part positioned between the emitter region and the first electrode and is formed of a transparent conductive material.

The first conductive type may be an n-type, and the second conductive type may be a p-type.

The anti-reflection part may include a first anti-reflection layer formed of aluminum oxide and a second anti-reflection layer formed of silicon nitride.

In another aspect, there is a solar cell including a semiconductor substrate of a first conductive type, an emitter region having a second conductive type different from the first conductive type, positioned at a first surface of the semiconductor substrate, and forming a charge accumulation layer at the first surface of the semiconductor substrate, a first electrode positioned on the first surface of the semiconductor substrate and coupled to the emitter region, and a second electrode positioned on the second surface of the semiconductor substrate and coupled to the semiconductor substrate.

The emitter region may be formed of silicon carbide.

The solar cell may further include an anti-reflection part positioned between the emitter region and the first electrode and is formed of a transparent conductive material.

The emitter region may be formed of amorphous silicon carbide.

The solar cell may further include a heavily doped region positioned between the first surface of the semiconductor substrate and the first electrode and containing impurities of the second conductive type at a concentration higher than the emitter region.

The solar cell may further include a passivation region positioned between the emitter region and the semiconductor substrate.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings.

DETAILED DESCRIPTION OF THE EMBODIMENTS

Figure 1:
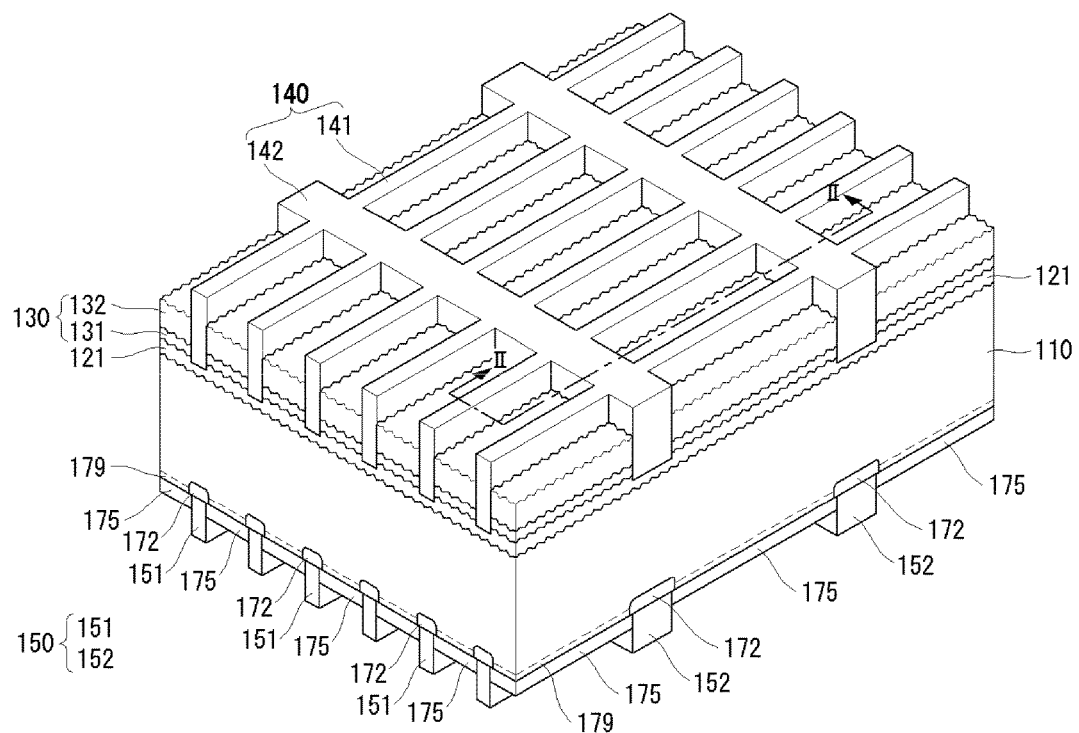
FIG. 1 is a partial perspective view of a solar cell according to an exemplary embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers may be used throughout the drawings to refer to the same or like parts. It will be understood that detailed description of known arts may be omitted if it is determined that the arts do not aid in the understanding of the embodiments of the invention.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Exemplary embodiments of the invention will be described with reference to FIGS. 1 to 9.

A solar cell according to an exemplary embodiment of the invention is described in detail with reference to FIGS. 1 and 2.

Figure 2:
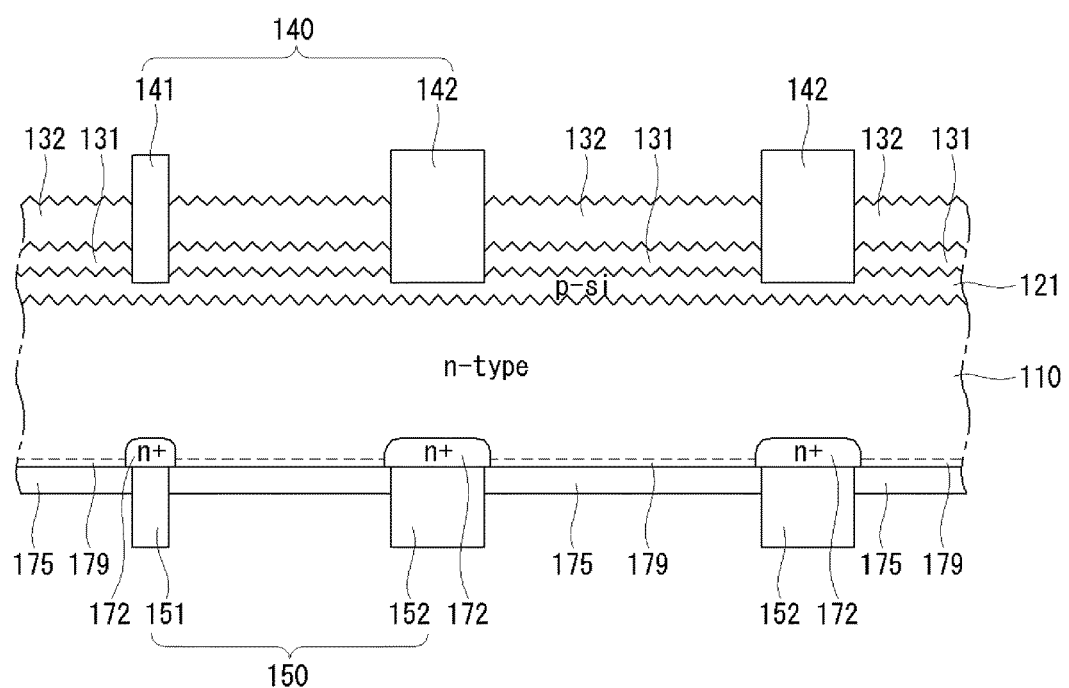
FIG. 2 is a cross-sectional view taken along line II-II of FIG. 1.

As shown in FIGS. 1 and 2, a solar cell according to an exemplary embodiment of the invention includes a substrate 110, an emitter region 121 positioned at a front surface (or a first surface) of the substrate 110, an anti-reflection part 130 positioned on the emitter region 121, a plurality of surface field regions 172 positioned at a back surface (or a second surface) opposite the front surface of the substrate 110, a semiconductor region 175 which is positioned on the back surface of the substrate 110 and is formed of a semiconductor material having a wide band gap, a front electrode part (or a first electrode part) 140 which is positioned on the front surface of the substrate 110, is connected to the emitter region 121 through the anti-reflection part 130, and includes a plurality of front electrodes (or a plurality of first electrodes) 141 and a plurality of front bus bars (or a plurality of first bus bars) 142, and a back electrode part (or a second electrode part) 150 which is positioned on the surface field regions 172, is connected to the surface field regions 172, and includes a plurality of back electrodes (or a plurality of second electrodes) 151 and a plurality of back bus bars (or a plurality of second bus bars) 152.

The substrate 110 is a semiconductor substrate formed of a semiconductor such as first conductive type silicon, for example, n-type silicon, although not required. The semiconductor used in the substrate 110 is a crystalline semiconductor, such as single crystal silicon and polycrystalline silicon.

When the substrate 110 is of an n-type, the substrate 110 is doped with impurities of a group V element such as phosphorus (P), arsenic (As), and antimony (Sb). Alternatively, the substrate 110 may be of a p-type and/or may be formed of a semiconductor material other than silicon. If the substrate 110 is of the p-type, the substrate 110 may be doped with impurities of a group III element such as boron (B), gallium (Ga), and indium (In).

As shown in FIGS. 1 and 2, a separate texturing process is performed on the flat front surface of the substrate 110 to form a textured surface corresponding to an uneven surface having a plurality of protrusions and a plurality of depressions or having uneven characteristics. In this instance, the emitter region 121 and the anti-reflection part 130 positioned on the front surface of the substrate 110 each have the textured surface.

As described above, because the front surface of the substrate 110 is textured, an incident area of the substrate 110 increases and a light reflectance decreases due to a plurality of reflection operations resulting from the protrusions and the depressions. Hence, an amount of light incident on the substrate 110 increases, and the efficiency of the solar cell is improved.

FIGS. 1 and 2 show that all of the projections of the textured surface have the same diameter and the same height for the sake of convenience. However, because the diameters and the heights of the projections are actually non-uniform, the plurality of projections having the different diameters and the different heights are formed on the front surface of the substrate 110.

The emitter region 121 positioned at the front surface of the substrate 110 is an impurity region doped with impurities of a second conductive type (for example, p-type) opposite the first conductive type (for example, n-type) of the substrate 110. Thus, the emitter region 121 of the second conductive type forms a p-n junction along with a first conductive type region (for example, an n-type region) of the substrate 110.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the n-type and the emitter region 121 is of the p-type, the electrons move to the back surface of the substrate 110, and the holes move to the emitter region 121.

The anti-reflection part 130 is positioned on the emitter region 121 on the front surface of the substrate 110 except on a formation area of the front electrode part 140.

The anti-reflection part 130 may be formed of a material, which prevents the reflection of light and transmits light, for example, a transparent material. The anti-reflection part 130 has a predetermined refractive index, thereby reducing a reflectance of light incident on the solar cell and increasing selectivity of a predetermined wavelength band. Hence, the efficiency of the solar cell is improved.

As shown in FIGS. 1 and 2, the anti-reflection part 130 includes a first anti-reflection layer 131 positioned on the emitter region 121 and a second anti-reflection layer 132 positioned on the first anti-reflection layer 131. In the embodiment of the invention, the first anti-reflection layer 131 may be formed of aluminum oxide ($Al_2O_3$), and the second anti-reflection layer 132 may be formed of hydrogenated silicon nitride (SiNx:H).

In the embodiment of the invention, the first anti-reflection layer 131 formed of aluminum oxide ($Al_2O_3$) may have a thickness of about 5 nm to 10 nm and a refractive index of about 1.1 to 1.6. The second anti-reflection layer 132 formed of hydrogenated silicon nitride (SiNx:H) may have a thickness of about 70 nm to 80 nm and a refractive index of about 2.0 to 2.2.

The first anti-reflection layer 131 formed of aluminum oxide ($Al_2O_3$) is positioned on the front surface of the substrate 110 (i.e., on the emitter region 121 on the front surface of the substrate 110) except on the formation area of the front electrode part 140.

In general, aluminum oxide ($Al_2O_3$) has negative fixed charges.

Thus, positive fixed charges (i.e., holes) are drawn to the emitter region 121 because of the first anti-reflection layer 131, which is positioned on the p-type emitter region 121 and is formed of aluminum oxide ($Al_2O_3$) having the negative fixed charges, and also negative fixed charges (i.e., electrons) moving to the emitter region 121 are pushed back to the back surface of the substrate 110.

Hence, an amount of holes moving to the emitter region 121 increases by the first anti-reflection layer 131 formed of aluminum oxide ($Al_2O_3$), and a recombination of electrons and holes at and around the emitter region 121 is prevented or reduced.

A defect existing at and around the front surface of the substrate 110 is changed to stable bonds due to oxygen (O) contained in aluminum oxide ($Al_2O_3$) for forming the first anti-reflection layer 131. Namely, oxygen (O) contained in the first anti-reflection layer 131 moves to the front surface of the substrate 110 and is coupled with a defect existing at and around the surface of the substrate 110, thereby changing the defect to stable bonds. In other words, oxygen (O) contained in the first anti-reflection layer 131 performs a passivation function.

The second anti-reflection layer 132, which is positioned on the first anti-reflection layer 131 and is formed of hydrogenated silicon nitride ($SiN_x$:H), also performs the passivation function using hydrogen (H) contained therein. Thus, hydrogen (H) contained in the second anti-reflection layer 132 moves to the first anti-reflection layer 131 and is coupled with a defect existing at and around the surface of the substrate 110, thereby changing the defect to stable bonds.

Hence, an amount of carriers lost by the defect at and around the surface of the substrate 110 is reduced because of the passivation function of the anti-reflection part 130 including the first and second anti-reflection layers 131 and 132.

When the thickness of the first anti-reflection layer 131 formed of aluminum oxide is equal to or greater than about 5 nm, the first anti-reflection layer 131 is more uniformly formed, and a field passivation effect using the fixed charges of the first anti-reflection layer 131 and the passivation function using oxygen (O) contained therein are more stably obtained. When the thickness of the first anti-reflection layer 131 is equal to or less than about 10 nm, manufacturing time and cost of the first anti-reflection layer 131 are reduced.

When the thickness of the second anti-reflection layer 132 formed of hydrogenated silicon nitride is equal to or greater than about 70 nm, the second anti-reflection layer 132 is more uniformly formed, and the passivation effect using hydrogen (H) contained therein is more stably obtained. When the thickness of the second anti-reflection layer 132 is equal to or less than about 80 nm, manufacturing time and cost of the second anti-reflection layer 132 are reduced.

Each of the plurality of surface field regions 172 positioned at the back surface of the substrate 110 is a doped region (for example, an $n^+$-type region) which is more heavily doped than the substrate 110 with impurities of the same conductive type as the substrate 110.

A potential barrier is formed by a difference between impurity concentrations of the first conductive type region of the substrate 110 and the surface field regions 172. Hence, the potential barrier prevents or reduces holes from moving to the surface field regions 172 used as a moving path of electrons and makes it easier for electrons to move to the surface field regions 172. Thus, the surface field regions 172 reduce an amount of carriers lost by a recombination and/or a disappearance of electrons and holes at and around the back surface of the substrate 110, and accelerate a movement of desired carriers (for example, electrons), thereby increasing an amount of carriers moving to the back electrode part 150.

Because the impurity concentration of the surface field regions 172 is higher than the impurity concentration of the substrate 110, the conductivity of the surface field regions 172 is better than the conductivity of the substrate 110.

As described above, the semiconductor region 175 positioned on the back surface of the substrate 110 is formed of the semiconductor material having the wide band gap. For example, the semiconductor region 175 may be formed of silicon carbide (SiC) having a band gap of about 2.36 eV.

The semiconductor region 175 is doped with impurities of the same first conductive type (for example, the n-type) as the substrate 110.

The semiconductor region 175 is positioned on the entire back surface of the substrate 110 except on a formation area of the back electrode part 150. Thus, the semiconductor region 175 is positioned between the adjacent back electrodes 151, between the back electrode 151 and the back bus bar 152, and between the adjacent back bus bars 152 on the back surface of the substrate 110. In another embodiment, the semiconductor region 175 may not be positioned at an edge of the back surface of the substrate 110 as well as the formation area of the back electrode part 150.

The semiconductor region 175 may contain, for example, phosphorus (P) of about $1\times10^{18}/cm^3$ to $5\times10^{20}/cm^3$ as the impurities of the first conductive type (for example, the n-type). A thickness of the semiconductor region 175 may be about 10 nm to 100 nm.

In the embodiment of the invention, the semiconductor region 175 is formed using a plasma enhanced chemical vapor deposition (PECVD) method. In this instance, a doping gas containing the impurities (for example, phosphorus (P)) of the first conductive type may be injected into a process room forming the semiconductor region 175, and thus the impurities of the first conductive type may be injected into the semiconductor region 175.

As described above, because the semiconductor region 175 contains the impurities of the same conductive type as the substrate 110, an energy band bending phenomenon occurs between the substrate 110 and the semiconductor region 175.

Figure 3:
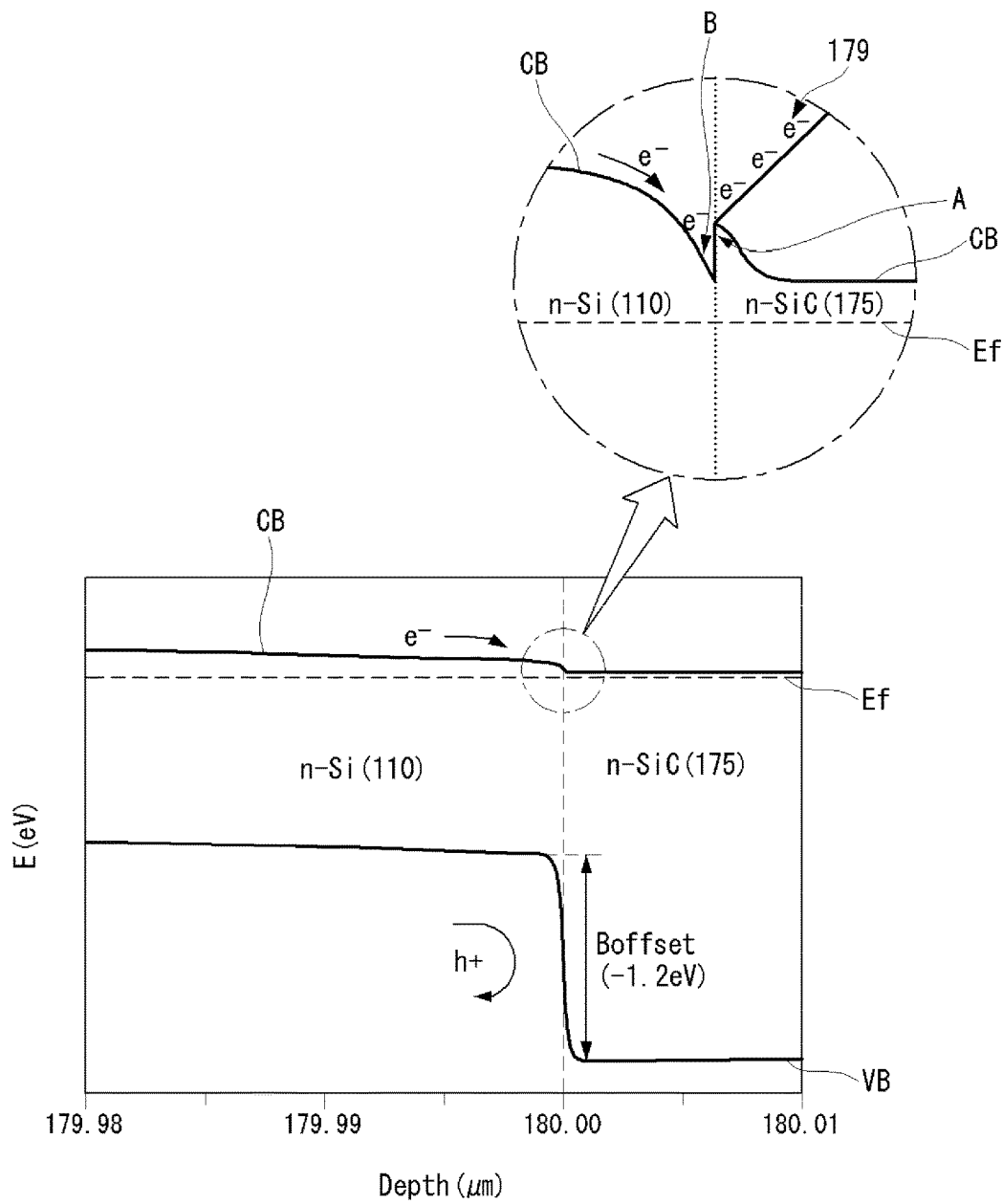
FIG. 3 shows an energy band diagram resulting from the junction between a substrate and a silicon carbide (SiC) layer at a back surface of a substrate according to an exemplary embodiment of the invention.

Accordingly, as shown in FIG. 3, an energy band of the substrate 110 formed of silicon and an energy band of the semiconductor region 175 formed of SiC are converted into an equilibrium state due to the energy band bending phenomenon of the substrate 110 and the semiconductor region 175.

In other words, a Fermi level Ef of the energy band of the substrate 110 and a Fermi level Ef of the energy band of the semiconductor region 175 are adjusted at the same level. Hence, conduction bands CB and valence bands VB of the substrate 110 and the semiconductor region 175 bend.

Accordingly, a height of an energy barrier in the conduction band CB is reduced, and a height of an energy barrier in the valence band VB increases. Hence, a magnitude of valence band offset 'Boffset' increases.

For example, in an energy band diagram produced by the junction between the substrate 110 and the surface field regions 172, a magnitude of valence band offset was about −0.18 eV. On the other hand, in an energy band diagram produced by the junction between the substrate 110 and the semiconductor region 175 in the embodiment of the invention, a magnitude of valence band offset was about −1.2 eV. Thus, an absolute value of the valence band offset produced in a junction surface between the substrate 110 and the semiconductor region 175 was increased by about 1.02 eV, as compared to the junction between the substrate 110 and the surface field regions 172.

In general, electrons move through the conduction band CB, and holes move through the valence band VB. Therefore, electrons moving from the n-type substrate 110 to the back surface (i.e., the semiconductor region 175) of the n-type substrate 110 easily pass through the conduction band CB, of which the energy barrier is reduced, due to the energy band bending resulting from the semiconductor region 175 and easily move from the back surface of the n-type substrate 110 to the semiconductor region 175.

On the other hand, the movement (from the back surface of the n-type substrate 110 to the semiconductor region 175) of holes existing in the n-type substrate 110 is adversely affected by the valence band offset increasing in the valence band VB. Hence, holes moving from the n-type substrate 110 to the semiconductor region 175 are blocked by the energy barrier resulting from the valence band offset, and thus do not move to the semiconductor region 175. And, the holes again return to the n-type substrate 110.

Thus, because the movement of electrons and holes to the back surface of the substrate 110 is controlled by the energy band bending between the substrate 110 and the semiconductor region 175, a recombination of electrons and holes generated at the back surface of the substrate 110 is reduced.

As shown in FIG. 3, a portion (for example, a level protrusion) 'A' of the junction conduction band between the substrate 110 and the semiconductor region 175, where the energy level of the semiconductor region 175 is higher than the energy level of the substrate 110, exists in the semiconductor region 175. Hence, a valley 'B' is formed in a junction surface between the substrate 110 and the semiconductor region 175.

Accordingly, the energy level of the substrate 110 in the conduction band decreases as it goes to the junction surface between the substrate 110 and the semiconductor region 175. The energy level of the semiconductor region 175 in the conduction band increases as it goes to the junction surface between the substrate 110 and the semiconductor region 175, and then is the same as the energy level of the substrate 110 in the junction surface between the substrate 110 and the semiconductor region 175.

As described above, because the valley 'B' formed by the level protrusion 'A' exists in the junction surface between the substrate 110 and the semiconductor region 175, electrons moving from the substrate 110 to the semiconductor region 175 along the conduction band are accumulated on the valley 'B'. Hence, a charge accumulation layer 179, on which the electrons are accumulated, is formed in the valley 'B'.

Accordingly, because the movement of electrons along the charge accumulation layer 179 is accelerated, the electrons moving from the substrate 110 to the semiconductor region 175 rapidly move along the semiconductor region 175 and then move to the back electrode part 150 through the surface field regions 172 adjacent to the semiconductor region 175.

As described above, the semiconductor region 175, which contains impurities of the same conductive type as the substrate 110 to generate the energy band bending of the substrate 110 and controls the movement of electrons and holes, has an energy band gap greater than silicon (Si) or amorphous silicon (a-Si). Therefore, an amount of light absorbed in the semiconductor region 175 decreases. Thus, because the amount of light (for example, light of a long wavelength band) absorbed in the semiconductor region 175 is not much, a loss amount of light (more specifically, light of the long wavelength band) incident on the substrate 110 decreases. Hence, the amount of light incident on the substrate 110 increases, and an amount of short circuit current output from the solar cell increases.

Further, because the semiconductor region 175 is easily doped with impurities of the first conductive type, the semiconductor region 175 of the first conductive type is easily manufactured.

As described above, the semiconductor region 175 containing impurities (for example, phosphorus (P)) of the first conductive type is formed on the back surface of the substrate 110 using the PECVD method, instead of diffusing impurities into the substrate 110 using a diffusion method or an ion implantation method to form the semiconductor region 175 inside the substrate 110 in the same manner as the surface field region 172.

Hence, there is no impurity diffused (or injected) into the substrate 110 due to the semiconductor region 175. Namely, the semiconductor region 175 does not increase the impurity doping concentration of the substrate 110.

As described above, when the n-type substrate 110 is used to manufacture the solar cell, the emitter region 121 for the p-n junction is formed by injecting a group III element, for example, boron (B) into the substrate 110, and also the surface field region 172 for the p-n junction is formed by injecting a group V element, for example, phosphorus (P) into the substrate 110.

The impurities injected into the substrate 110 normally form the p-n junction or provide the field effect through the surface field regions. However, when an amount of impurities injected into the substrate 110 excessively increases, the impurities serve as the defect. Thus, as the impurity doping concentration of the substrate 110 increases, the lifetime of minority carriers is sharply reduced.

Accordingly, when impurities of the corresponding conductive type (for example, the n-type) are injected into the substrate 110 to form the surface field region 172, an amount of impurities injected into the substrate 110 increases. Hence, a loss amount of carriers increases.

However, in the embodiment of the invention, the doping concentration of the impurities (for example, the n-type impurities) of the substrate 110 does not increase due to the semiconductor region 175. Therefore, a loss of carriers of the substrate 110 resulting from the impurities of the semiconductor region 175 is not generated.

When the doping concentration of the impurities (for example, the n-type impurities) contained in the semiconductor region 175 is equal to or greater than about $1 \times 10^{18}$/cm$^3$, the band bending is more stably generated in the junction surface between the substrate 110 and the semiconductor region 175, and the charge accumulation layer 179 is more smoothly formed. When the doping concentration of the impurities (for example, the n-type impurities) contained in the semiconductor region 175 is equal to or less than about $5 \times 10^{20}$/cm$^3$, an impurity doping operation of the semiconductor region 175 is easily performed.

When the thickness of the semiconductor region 175 is equal to or greater than about 10 nm, the semiconductor region 175 is uniformly formed on the back surface of the substrate 110. When the thickness of the semiconductor region 175 is equal to or less than about 100 nm, manufacturing time and the manufacturing cost of the semiconductor region 175 are reduced.

Because the semiconductor region 175 is resistive to heat, the semiconductor region 175 is little damaged by the heat applied during the manufacturing process of the solar cell. Hence, the degradation of the solar cell is reduced.

Changes in the lifetime of carriers depending on changes in the impurity concentration of the substrate 110 are described below with reference to FIG. 4.

Figure 4:
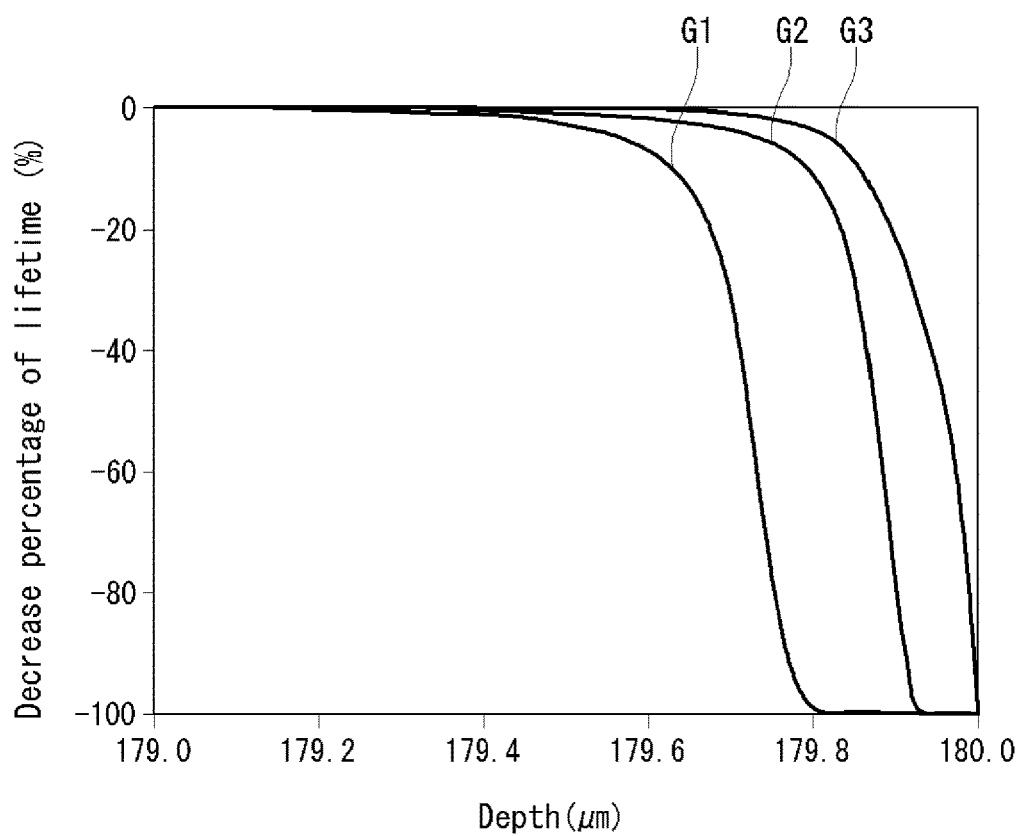
FIG. 4 is a graph illustrating a decrease percentage of the lifetime of minority carriers depending on an impurity doping concentration of a substrate.

FIG. 4 illustrates changes in the lifetime of minority carriers depending on changes in a thickness of the substrate in a surface field region existing inside the substrate when there is no semiconductor region according to a comparative example and changes in the lifetime of minority carriers depending on changes in a thickness of the substrate 110 with the semiconductor region 175 according to the embodiment of the invention.

In FIG. 4, a depth of a horizontal axis indicates a depth of a substrate having a thickness of about 180 µm. Thus, as the depth of the substrate is close to 180 µm, it is close to the back surface of the substrate, on which the surface field region 172 or the semiconductor region 175 is positioned. As the depth of the substrate is far from 180 µm, it is close to the front surface (i.e., the front surface of the emitter region 121) of the substrate, on which the front electrode part 140 is positioned. In FIG. 4, a vertical axis indicates a decrease in percentage of the lifetime of minority carriers.

In FIG. 4, 'G1' and 'G2' denote graphs according to the comparative example, and 'G3' denotes a graph according to the embodiment of the invention. The graph G1 indicates changes in the lifetime of minority carriers in a surface field region having a sheet resistance of about 120 Ω/sq., and the graph G2 indicates changes in the lifetime of minority carriers in a surface field region having a sheet resistance of about 300 Ω/sq. The graph G3 indicates changes in the lifetime of minority carriers at the substrate, on which the semiconductor region according to the embodiment of the invention is positioned.

Because a sheet resistance is reduced as an impurity doping concentration increases, an impurity doping concentration of the surface field region having the sheet resistance of about 120 Ω/sq. is higher than an impurity doping concentration of the surface field region having the sheet resistance of about 300 Ω/sq.

As shown in FIG. 4, the lifetime of carriers decreases as they go from the front surface to the back surface of the substrate. A time at which the lifetime of carriers sharply decreases may depend on the doping concentration of the impurities.

Namely, in the graph G1 of the substrate at which the surface field region having the highest impurity doping concentration among the three graphs G1 to G3 and the sheet resistance of about 120 Ω/sq. is positioned, when the depth of the substrate reached about 179.6 µm, the lifetime of the minority carriers was sharply reduced. In the graph G2 of the substrate at which the surface field region having the impurity doping concentration, which is lower than the graph G1 and higher than the graph G3, and the sheet resistance of about 300 Ω/sq. is positioned, when the depth of the substrate reached about 179.8 µm, the lifetime of the minority carriers was sharply reduced.

On the other hand, in the graph G3, in which the semiconductor region according to the embodiment of the invention is positioned on the back surface of the substrate, when the depth of the substrate reached about 179.9 µm, the lifetime of the minority carriers was sharply reduced. Thus, in the graph G3, a moving distance of the minority carriers may approach about 180 µm, which is almost equal to the thickness of the substrate.

In other words, even if the semiconductor region containing impurities is positioned on the substrate, the impurities contained in the semiconductor region do not adversely affect the lifetime of the minority carriers.

Accordingly, desired carriers (for example, electrons) may quickly move from the front surface to the back surface of the substrate due to the semiconductor region according to the embodiment of the invention without a reduction in the lifetime of the carriers.

As described above, the front electrode part 140 on the front surface of the substrate 110 includes the plurality of front electrodes 141 abutting on the emitter region 121 and the plurality of front bus bars 142 which abut on the emitter region 121 and are connected to the front electrodes 141.

The front electrodes 141 are electrically and physically connected to the emitter region 121 and are separated from one another. The front electrodes 141 extend parallel to one another in a fixed direction. The front electrodes 141 collect carriers (for example, holes) moving to the emitter region 121.

The front bus bars 142 are electrically and physically connected to the emitter region 121 and extend parallel to one another in a direction crossing the front electrodes 141.

The front bus bars 142 have to collect not only carriers (for example, holes) moving from the emitter region 121 but also carriers collected by the front electrodes 141 crossing the front bus bars 142 and have to move the collected carriers in a desired direction. Thus, a width of each front bus bar 142 may be greater than a width of each front electrode 141.

In the embodiment of the invention, the front bus bars 142 are positioned on the same level layer as the front electrodes 141 and are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a direction crossing the front electrodes 141, for example, in a longitudinal (or transverse) direction. Hence, the front electrode part 140 has a lattice shape on the front surface of the substrate 110.

The front bus bars 142 are connected to an external device and output the collected carriers to the external device.

The front electrode part 140 including the front electrodes 141 and the front bus bars 142 is formed of at least one conductive material, for example, silver (Ag).

In the embodiment of the invention, the number of front electrodes 141 and the number of front bus bars 142 may vary, if desired or necessary.

The back electrode part 150 on the back surface of the substrate 110 passes through the semiconductor region 175, abuts on the surface field regions 172, and includes the plurality of back electrodes 151 and the plurality of back bus bars 152 connected to the back electrodes 151.

The back electrodes 151 contact the surface field regions 172 positioned at the back surface of the substrate 110. The back electrodes 151 are separated from one another and extend parallel to one another in a fixed direction. In this embodiment, the back electrodes 151 extend in the same direction as the front electrodes 141 positioned on the front surface of the substrate 110.

The back electrodes 151 may be formed of a conductive material, for example, aluminum (Al), silver (Ag), or an alloy of Al and Ag.

The back electrodes 151 collect carriers (for example, electrons) moving to the surface field regions 172.

In the embodiment of the invention, each back electrode 151 may have a width of about 25 µm, and a distance between the back electrodes 151 may be about 0.01 mm to 0.05 mm. When the back electrodes 151 are designed in conformity with the above conditions, power consumption of the solar cell is reduced, and a fill factor of the solar cell is greatly improved.

The back bus bars 152 are separated from one another and extend in a direction crossing the back electrodes 151. The back bus bars 152 are positioned opposite the front bus bars 142. Hence, the back bus bars 152 are electrically and physically connected to the back electrodes 151 at crossings of the back electrodes 151 and the back bus bars 152.

The back bus bars 152 abut on the surface field regions 172 positioned into the substrate 110. Hence, the surface field regions 172 are positioned in the back surface of the substrate 110 abutting on the back electrode part 150 including the back electrodes 151 and the back bus bars 152. Namely, the surface field regions 172 do not exist between the adjacent back electrodes 151, between the back electrode 151 and the back bus bar 152, and between the adjacent back bus bars 152 at the back surface of the substrate 110. Thus, the surface field regions 172 have a lattice shape in the same manner as the back electrode part 150. A formation area of the surface field regions 172 is further reduced when compared to the surface field region which is formed at the entire back surface of the substrate 110 or at the entire back surface of the substrate 110 except edges.

The back bus bars 152 collect carriers transferred from the back electrodes 151, similar to the front bus bars 142. The back bus bars 152 are connected to the external device and output the collected carriers (for example, electrons) to the external device.

The back bus bars 152 may be formed of a material with the conductivity better than the back electrodes 151. The back bus bars 152 may contain at least one conductive material, for example, silver (Ag).

As described above, because the back electrode part 150 including the back electrodes 151 and the back bus bars 152 contacts the surface field regions 172 having the impurity doping concentration higher than the substrate 110, a contact resistance between the substrate 110 (i.e., the surface field regions 172) and the back electrode part 150 is reduced, and a transfer efficiency of carriers from the substrate 110 to the back electrode part 150 is improved.

The solar cell having the above-described structure is a bifacial solar cell in which light is incident on at least one of the front surface and the back surface of the substrate 110. An operation of the bifacial solar cell is described below.

When light irradiated to the solar cell is incident on the emitter region 121 and the substrate 110 which are the semiconductor parts, through the anti-reflection part 130, electron- and hole pairs are generated in the semiconductor parts by light energy produced based on the incident light. In this instance, because a reflection loss of light incident on the substrate 110 is reduced by the textured surface of the substrate 110 and the anti-reflection part 130, an amount of light incident on the substrate 110 increases.

The electrons move to the n-type semiconductor part (for example, the substrate 110) and the holes move to the p-type semiconductor part (for example, the emitter region 121) by the built-in potential difference of the p-n junction of the substrate 110 and the emitter region 121. The holes moving to the emitter region 121 are collected by the front electrodes 141 and the front bus bars 142 and then move along the front bus bars 142. The electrons moving to the substrate 110 are collected by the back electrodes 151 and then move along the back bus bars 152. When the front bus bars 142 are connected to the back bus bars 152 using electric wires, current flows therein to thereby enable use of the current for electric power.

In the solar cell according to the embodiment of the invention, the semiconductor region 175 containing impurities of the same conductive type as the substrate 110 is positioned on the back surface of the substrate 110.

The energy band bending phenomenon of the substrate 110 and the semiconductor region 175 occurs due to the junction of the substrate 110 and the semiconductor region 175. The energy band bending phenomenon interrupts the movement of holes from the substrate 110 to the semiconductor region 175 and makes it easier for electrons to move from the substrate 110 to the semiconductor region 175.

Hence, an amount of electrons collected by the back electrodes 151 further increases, and an amount of holes moving to the back surface of the substrate 110 further decreases. As a result, a recombination and/or a disappearance of electrons and holes at and around the back surface of the substrate 110 is reduced.

Because the semiconductor region 175 is not positioned inside the substrate 110 and is positioned on the back surface of the substrate 110, the semiconductor region 175 does not increase a doping concentration of impurities inside the substrate 110. Thus, the movement of carriers to the back surface of the substrate 110 is improved without a reduction in the lifetime of carriers resulting from an increase in an amount of impurities inside the substrate 110 and without a loss of carriers resulting from impurities.

In addition, because the surface field regions 172 are formed only in a portion of the substrate 110 abutting on the back electrode part 150 or only in and around the portion of the substrate 110, the formation area of the surface field regions 172 decreases. Hence, a reduction in the lifetime of carriers resulting from the impurities and a loss of carriers resulting from the impurities are reduced or prevented.

Figure 5:
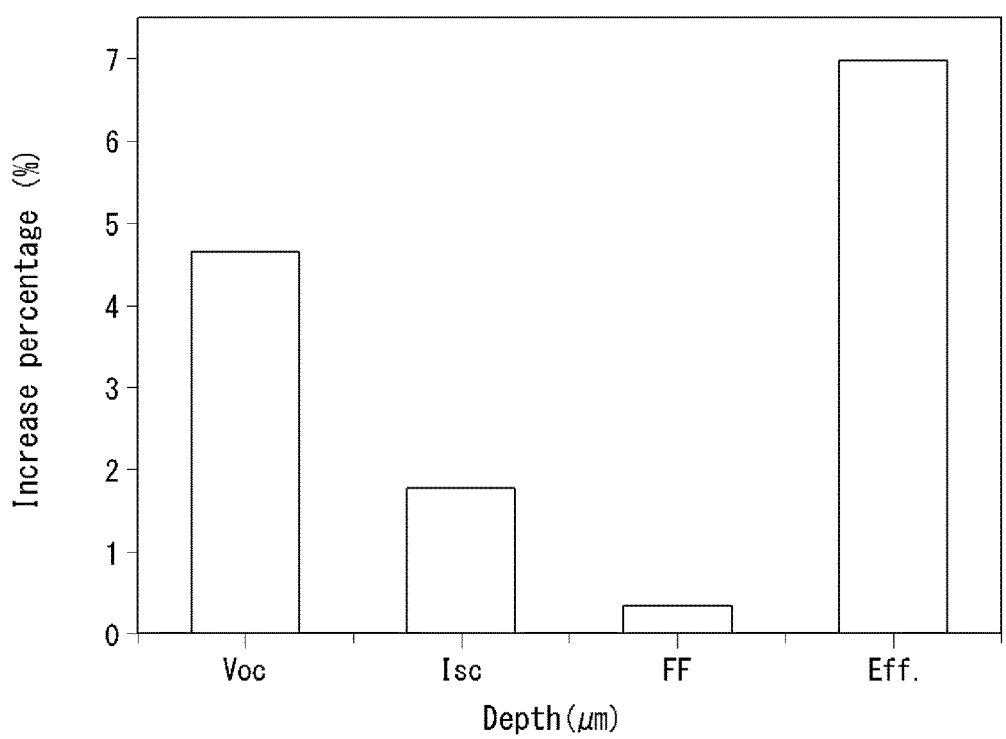
FIG. 5 is a graph illustrating an increase percentage of each of an open-circuit voltage, a short circuit current, a fill factor, and an efficiency in a solar cell according to an exemplary embodiment of the invention.

In the solar cell according to the embodiment of the invention, as shown in FIG. 5, an open-circuit voltage Voc, a short circuit current Isc, a fill factor FF, and an efficiency Eff increased. In the graph shown in FIG. 5, a solar cell according to a comparative example as a reference is a bifacial solar cell, in which an emitter region is positioned at an entire front surface of a substrate, a surface field region is positioned at an entire back surface of the substrate, and a plurality of back electrodes and a plurality of back bus bars abut on the surface field region. In the solar cell according to the comparative example, the surface field region exists between the adjacent back electrodes, between the back electrode and the back bus bar, and between the adjacent back bus bars at the back surface of the substrate.

As shown in FIG. 5, when compared to the solar cell according to the comparative example, in the solar cell according to the embodiment of the invention, the open-circuit voltage Voc increased by about 4.5%, the short circuit current Isc increased by about 1.5%, and the efficiency Eff increased by about 6.5%. Further, the fill factor FF according to the embodiment of the invention increased as compared to the comparative example.

In the embodiment of the invention, the open-circuit voltage Voc and the short circuit current Isc increased because an electron/hole collection layer (i.e., the semiconductor region 175) not containing impurities was formed due to the energy band bending phenomenon to thereby improve the passivation characteristic.

In the comparative example in which impurities of a first conductive type (for example, n-type) are artificially injected into the semiconductor substrate for manufacturing the solar cell to form a heavily doped layer at the entire back surface of the substrate and electric current is collected using the heavily doped layer, a loss of carriers (for example, electrons) at the substrate is generated by impurities of the heavily doped layer. Hence, the lifetime of carriers is reduced.

On the other hand, in the embodiment of the invention, the surface of the substrate 110 is passivated using the semiconductor region 175 without separately injecting impurities of a first conductive type (for example, n-type) into the semiconductor substrate 110 for manufacturing the solar cell, and a movement layer (i.e., the charge accumulation layer 179) capable of moving carriers is formed using a difference between the band energies of the semiconductor region 175 and the substrate 110. In this instance, carriers are collected without a reduction in the lifetime of carriers resulting from impurities contained in the substrate 110. Thus, an amount of collected carriers increases, and the open-circuit voltage Voc and the short circuit current Isc increase.

In the solar cell shown in FIGS. 1 to 3, impurities of a corresponding conductive type are injected (or doped) into the substrate 110 to form a portion of the substrate 110 as the emitter region 121. Therefore, both the substrate 110 and the emitter region 121 are formed of the semiconductor material (for example, crystalline semiconductor) of the substrate 110. Thus, the substrate 110 and the emitter region 121 form a homojunction solar cell.

On the other hand, even when the substrate and the emitter region are formed of different semiconductor materials, for example, the substrate is formed of a crystalline semiconductor, such as single crystal silicon and polycrystalline silicon, and the emitter region is formed of a non-crystalline semiconductor such as amorphous silicon, and thus the substrate and the emitter region form a heterojunction solar cell, the semiconductor region 175 may be used.

An example of the heterojunction solar cell is described below with reference to FIGS. 6 to 9.

Structures and components identical or equivalent to those described in the solar cell shown in FIGS. 1 to 3 may be designated with the same reference numerals, and a further description may be briefly made or may be entirely omitted.

Figure 6:
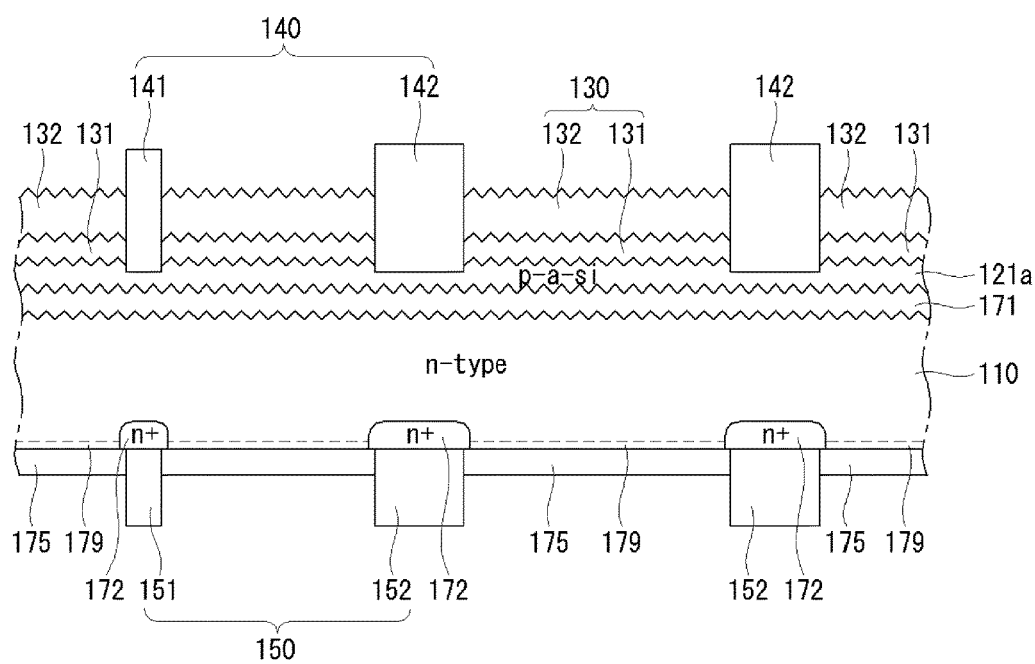
FIGS. 6 to 8 are cross-sectional views showing various examples of a heterojunction solar cell according to an exemplary embodiment of the invention.

As shown in FIG. 6, a solar cell having a heterojunction structure includes a substrate 110 formed of a crystalline semiconductor of a first conductive type and an emitter region 121a which is positioned on the substrate 110 and is formed of a non-crystalline semiconductor (for example, p-type amorphous silicon) of a second conductive type.

A passivation region 171 is positioned between the substrate 110 and the emitter region 121a to perform a passivation function for removing a defect existing at and around a front surface of the substrate 110. Hence, the passivation region 171 reduces an amount of carriers lost by the defect.

The passivation region 171 may be formed of amorphous silicon, in particular, intrinsic amorphous silicon. Each of carriers (for example, holes) produced in the substrate 110 is thick enough to pass through the passivation region 171 and to move to the emitter region 121a. For example, a thickness of the passivation region 171 may be about 1 nm to 10 nm. The passivation region 171 may be omitted.

The emitter region 121a and the passivation region 171 may be formed using a deposition method such as a plasma enhanced chemical vapor deposition (PECVD) method.

In the same manner as the solar cell shown in FIGS. 1 and 2, the solar cell shown in FIG. 6 includes a back electrode part 150 including a plurality of back electrodes 151 and a plurality of back bus bars 152 positioned on the back surface of the substrate 110, a semiconductor region 175 positioned on the back surface of the substrate 110, on which the back electrode part 150 is not positioned, a charge accumulation layer 179 which is formed at the back surface of the substrate 110 due to the semiconductor region 175, and a plurality of surface field regions 172 which are formed at the back surface of the substrate 110 under the back electrode part 150.

A difference between energy band gaps of the substrate 110 formed of the crystalline semiconductor and the emitter region 121a formed of the non-crystalline semiconductor in the heterojunction solar cell shown in FIG. 6 is greater than a difference between energy band gaps in the homojunction solar cell. Hence, in the heterojunction solar cell shown in FIG. 6, an open-circuit voltage Voc increases, and the efficiency of the solar cell is further improved.

As described above with reference to FIGS. 1 to 5, an amount of carriers (for example, electrons) collected by the back electrode part 150 increases due to an energy band bending phenomenon resulting from the semiconductor region 175 positioned at the back surface of the substrate 110 and the charge accumulation layer 179, and an amount of carriers lost by a recombination and/or a disappearance of carriers decreases. In addition, because the surface field regions 172 almost have a lattice shape under the back electrode part 150, a formation area of the surface field regions 172 is reduced. Hence, an amount of carriers lost by impurities of the surface field regions 172 decreases.

Figure 7:
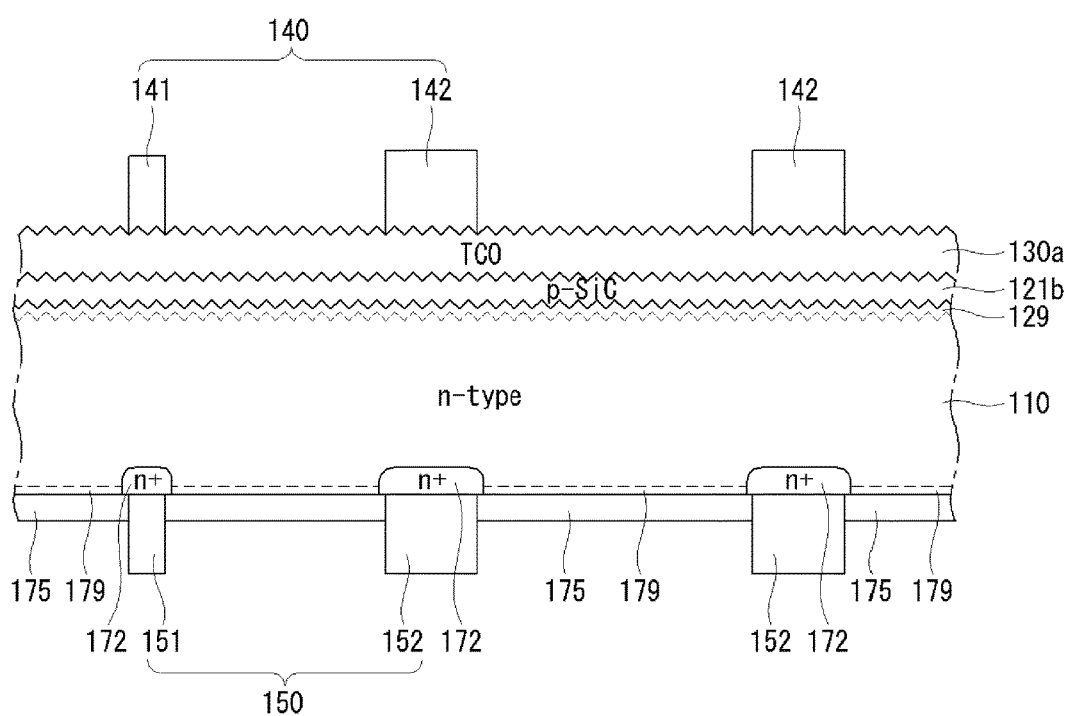

In an alternative embodiment, as shown in FIG. 7, an emitter region 121b positioned at a front surface of a substrate 110 may be formed of a semiconductor material having a wide band gap, for example, silicon carbide (SiC). Thus, in this instance, the emitter region 121b is a semiconductor layer formed of the semiconductor material which is doped with impurities of a second conductive type and has the wide band gap.

Thus, as shown in FIG. 7, when the substrate 110 is of an n-type, the emitter region 121b is formed of p-type silicon carbide (SiC).

The emitter region 121b formed of p-type SiC may be formed at the front surface of the substrate 110 using a deposition method such as a PECVD method. The emitter region 121b has the second conductive type different from the substrate 110 using a doping gas containing impurities of a desired conductive type (for example, p-type) when the emitter region 121b is formed.

Further, as shown in FIG. 7, the solar cell according to the embodiment of the invention includes an anti-reflection part 130a, which is positioned on the emitter region 121b and is formed of a transparent conductive material such as transparent conductive oxide (TCO). For example, the anti-reflection part 130a may be formed of indium tin oxide (ITO). The anti-reflection part 130a is positioned on the entire front surface of the substrate 110 or the entire front surface of the substrate 110 except an edge.

As described above with reference to FIGS. 1 and 2, a front electrode part 140 including a plurality of front electrodes 141 and a plurality of front bus bars 142 connected to the front electrodes 141 is positioned on the anti-reflection part 130a.

Since a structure of a back surface of the substrate 110 is substantially the same as FIGS. 1 and 2, a further description may be briefly made or may be entirely omitted.

As described above, when the emitter region 121b doped with the impurities of the second conductive type is formed of the semiconductor material, for example, silicon carbide (SiC) having the wide band gap, an energy band bending phenomenon occurs between the substrate 110 and the emitter region 121b, similar to the description of FIG. 3 based on the semiconductor region 175. A conduction band CB and a valence band VB of each of the substrate 110 and the semiconductor region 175 are bent because of the energy band bending phenomenon.

Figure 9:
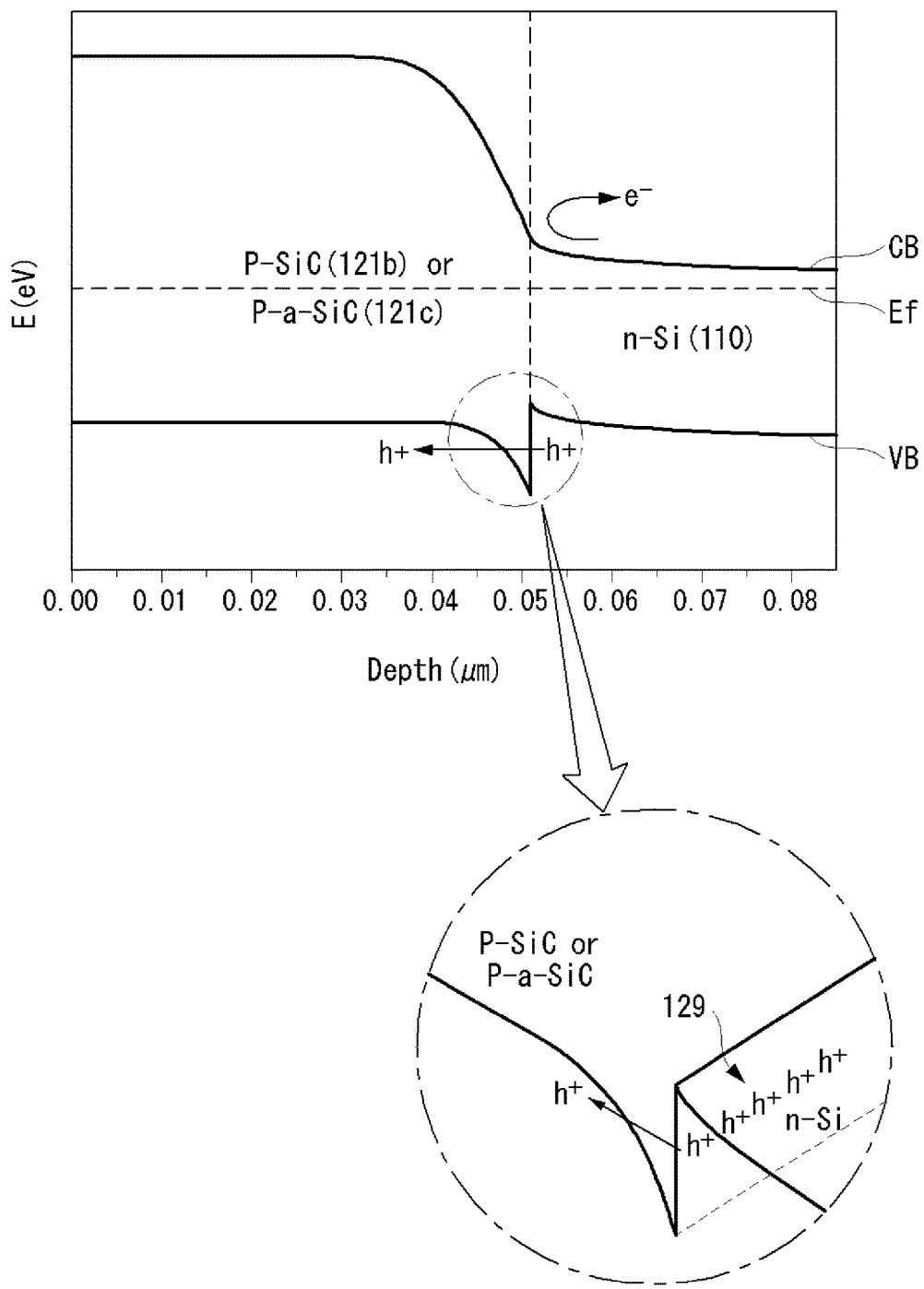
FIG. 9 shows an energy band diagram resulting from the junction between a substrate and a silicon carbide (SiC) layer at a front surface of the substrate according to an exemplary embodiment of the invention.

However, in this instance, as shown in FIG. 9, a height of the energy level increases in the conduction band and the valence band, unlike FIG. 3. Hence, a magnitude of an energy barrier (i.e., the band offset in the conduction band) in the conduction band increases.

Accordingly, the movement of electrons, which move from the n-type substrate 110 to the p-type emitter region 121b through the conduction band, is adversely affected by an increase in the magnitude of the energy barrier in the conduction band. Hence, an amount of electrons moving from the n-type substrate 110 to the p-type emitter region 121b decreases.

The electrons tunnel through an energy barrier generated by an increase in the energy level in the valence band resulting from the energy band bending between the substrate 110 and the emitter region 121b, and then move from the substrate 110 to the emitter region 121b.

As shown in FIG. 9, a valley 129 is formed at an interface between the substrate 110 and the emitter region 121b due to the energy band bending between the substrate 110 and the emitter region 121b. Hence, holes moving from the substrate 110 are accumulated on the valley 129, and thus the valley 129 may serve as a charge accumulation layer.

In this embodiment, as described above, the anti-reflection part 130a positioned between the front electrode part 140 and the emitter region 121b is formed of transparent conductive oxide (TCO) which has a predetermined work function and the good conductivity.

Accordingly, carriers (for example, holes), which move to the emitter region 121b and are positioned at the charge accumulation layer 129, more easily move to the anti-reflection part 130a due to the work function of the anti-reflection part 130a and then move to the front electrode part 140. It is preferable, but not required, that the anti-reflection part 130a formed of transparent conductive oxide (TCO) has the work function equal to or greater than about 5 eV. In this instance, the carriers moving to the emitter region 121b may more easily move to the front electrode part 140.

Further, contact characteristic between the front electrode part 140 formed of metal and the emitter region 121b is improved due to the anti-reflection part 130a positioned between the front electrode part 140 and the emitter region 121b. Hence, an amount of carriers moving from the emitter region 121b to the front electrode part 140 increases.

However, in an alternative embodiment, the anti-reflection part 130a may be formed of an insulation material having an anti-reflection function, for example, silicon nitride or aluminum oxide in the same manner as the anti-reflection part 130 shown in FIGS. 1 and 2. In this instance, the front electrode part 140 passes through the anti-reflection part 130a and contacts the emitter region 121b.

Figure 8:
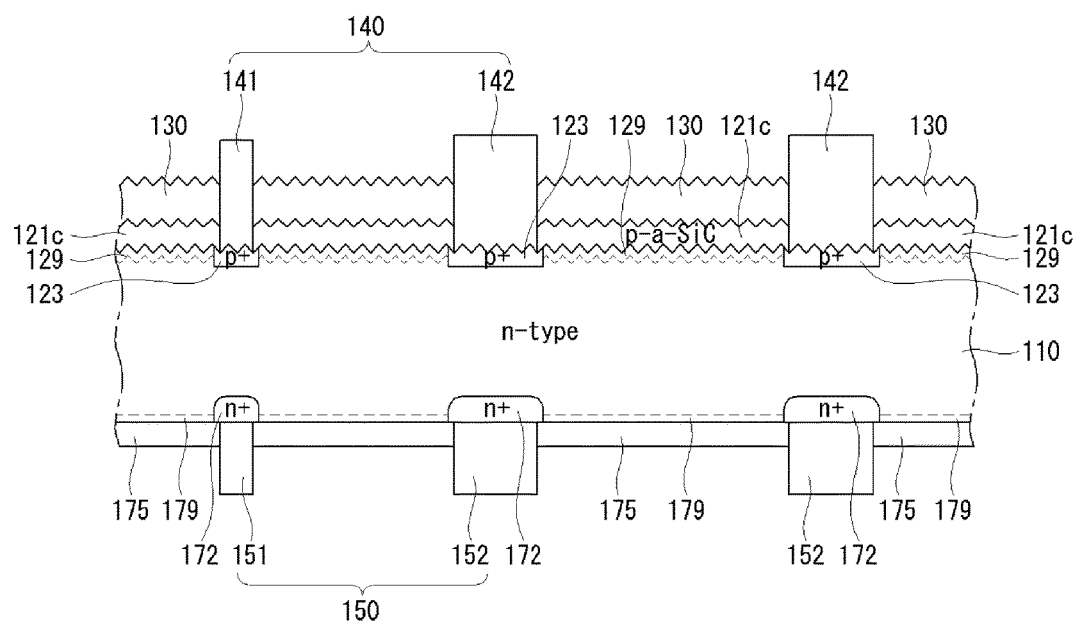

In an alternative embodiment, the solar cell according to the embodiment of the invention has a structure shown in FIG. 8.

The solar cell shown in FIG. 8 substantially has the same structure as the solar cell shown in FIG. 7, except a structure of an emitter region 121c positioned at a front surface of a substrate 110.

More specifically, as shown in FIG. 8, a front electrode part 140 including a plurality of front electrodes 141 and a plurality of front bus bars 142 connected to the front electrodes 141 is positioned on the front surface of the substrate 110. The emitter region 121c is positioned at the front surface of the substrate 110, on which the front electrode part 140 is not positioned.

The solar cell shown in FIG. 8 further include a heavily doped region 123, which is positioned into the substrate 110 positioned under and around the front electrode part 140 and contains impurities of a second conductive type at a doping concentration higher than the substrate 110 and the emitter region 121c. The conductivity of the heavily doped region 123 increases due to the higher doping concentration of the second conductive type impurities, and thus a sheet resistance of the heavily doped region 123 decreases. Hence, a contact resistance between the heavily doped region 123 and the front electrode part 140 is reduced.

Accordingly, the heavily doped region 123 is not positioned between the adjacent front electrodes 141, between the front electrode 141 and the front bus bar 142, and between the adjacent front bus bars 142.

In the embodiment of the invention, the emitter region 121c is formed of amorphous silicon carbide (SiC) doped with the impurities of the second conductive type (for example, p-type) different from a conductive type of the substrate 110.

Accordingly, the emitter region 121c and the heavily doped region 123 form a p-n junction along with the substrate 110.

In the solar cell having the above-described structure, the emitter region 121c forms the p-n junction along with the substrate 110 and also performs the same function as a semiconductor region 175 positioned at a back surface of the substrate 110.

As described above with reference to FIG. 7, when carriers (for example, holes) move from the substrate 110 to the emitter region 121c and are accumulated on the charge accumulation layer 129, the carriers accumulated on the valley (i.e., the charge accumulation layer 129) move along a path formed by the charge accumulation layer 129 and easily move to the front electrode part 140 through the heavily doped region 123 adjacent to the charge accumulation layer 129, similar to the solar cell shown in FIGS. 1 and 2.

Because the front electrode part 140 contact the heavily doped region 123 having the improved conductivity due to the higher impurity doping concentration in the same manner as a back electrode part 150 connected to surface field regions 172 positioned at the back surface of the substrate 110, carriers moving along the emitter region 121c more easily move to the front electrode part 140 through the heavily doped region 123.

In the solar cell shown in FIGS. 7 and 8, a passivation region 171 (refer to FIG. 6) may be formed directly on the substrate 110, so as to prevent and reduce a loss of carriers resulting from a defect existing at and around the front surface of the substrate 110. The passivation region 171 may be positioned between the substrate 110 and the emitter region 121b or 121c. In this instance, an amount of carriers lost by the defect decreases, and thus the efficiency of the solar cell is improved.

Unlike the solar cell shown in FIGS. 7 and 8, the surface field regions 172 positioned at the back surface of the substrate 110 are formed of amorphous silicon, which contains impurities of a first conductive type at a doping concentration higher than the substrate 110. In this instance, the semiconductor region 175 positioned at the back surface of the substrate 110 may be omitted. In addition, the back electrode part 150 is positioned on the surface field regions 172 which are positioned at the back surface of the substrate 110 and are formed of amorphous silicon of the first conductivity type. Unlike the solar cell shown in FIGS. 7 and 8, the plurality of back electrodes 151 may be formed as one back electrode which is positioned on the surface field regions 172 except a formation area of the back bus bars 152 or positioned on the entire back surface of the substrate 110 except the formation area of the back bus bars 152 and an edge of the back surface of the substrate 110.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a crystalline silicon semiconductor substrate of a first conductive type;
an emitter region having a second conductive type different from the first conductive type and at a first surface of the crystalline silicon semiconductor substrate, wherein the emitter region forms a p-n junction along with the crystalline silicon semiconductor substrate;
a silicon carbide layer directly on a second surface opposite the first surface of the crystalline silicon semiconductor substrate configured to form a first charge accumulation layer in the second surface of the crystalline silicon semiconductor substrate, and having a first impurity doping concentration of the first conductive type, the first charge accumulation layer to accumulate charge caused by a difference in band gap between the crystalline silicon semiconductor substrate and the silicon carbide layer;
a first electrode on the first surface of the crystalline silicon semiconductor substrate and coupled to the emitter region;
a heavily doped region under the first electrode and containing impurities of a second conductive type at a doping concentration higher than the crystalline semiconductor substrate and a second charge accumulation layer;
a second electrode on the second surface of the crystalline silicon semiconductor substrate and coupled to the crystalline silicon semiconductor substrate;
a surface field region partially in the second surface of the crystalline silicon semiconductor substrate and having a second impurity doping concentration of the first conductive type higher than the first impurity doping concentration of the silicon carbide layer; and
an anti-reflection part on the emitter region,
wherein the silicon carbide layer has a plurality of openings and the second electrode contacts the surface field region through the plurality of openings of the silicon carbide layer,
wherein a conduction band average energy level of the crystalline silicon semiconductor substrate is higher than a conduction band average energy level of the silicon carbide layer, and
wherein an amount of impurities contained of the silicon carbide layer is $1\times10^{18}$/cm$^3$ to $5\times10^{20}$/cm3, and
wherein the emitter region is formed of a silicon carbide to form the second charge accumulation layer in the first surface of the crystalline silicon semiconductor substrate to accumulate charge caused by a difference in band gap between the crystalline silicon semiconductor substrate and the emitter region.

2. The solar cell of claim 1, wherein the anti-reflection part is between the emitter region and the first electrode and includes a transparent conductive material.

3. The solar cell of claim 1, the heavily doped region between the first surface of the crystalline silicon semiconductor substrate and the first electrode and includes impurities of the second conductive type at a concentration higher than the emitter region.

4. The solar cell of claim 1, further comprising a passivation region between the emitter region and the crystalline silicon semiconductor substrate.

5. The solar cell of claim 1, wherein a conduction band energy level of the crystalline silicon semiconductor substrate decreases toward a junction surface between the crystalline silicon semiconductor substrate and the silicon carbide layer,
wherein a conduction band energy level of the silicon carbide layer increases toward the junction surface,
wherein the conduction band energy level of the crystalline silicon semiconductor substrate at the junction surface is lower than the conduction band energy level of the silicon carbide layer at the junction surface, and
wherein an energy valley on which electrons are accumulated is in the junction surface.

6. The solar cell of claim 1, wherein the silicon carbide layer has a thickness of 10 nm to 100 nm.

7. The solar cell of claim 1, wherein the first conductive type is an n-type, and the second conductive type is a p-type.

8. The solar cell of claim 1, wherein the anti-reflection part includes a first anti-reflection layer including aluminum oxide having a thickness of 5 nm 10 nm on the emitter region and a second anti-reflection layer including silicon nitride having a thickness of 70 nm 80 nm on the first anti-reflection.

9. The solar cell of claim 1, wherein the first surface of the crystalline silicon semiconductor substrate has a textured surface and the second surface opposite to the first surface has a flat surface.

* * * * *